(12) United States Patent
Hsieh et al.

(10) Patent No.: US 8,825,191 B2
(45) Date of Patent: Sep. 2, 2014

(54) SYSTEM AND METHOD FOR IMPROVED AUTOMATED SEMICONDUCTOR WAFER MANUFACTURING

(71) Applicant: Taiwan Semiconductor Manufacturing Company, Ltd., Hsin-Chu (TW)

(72) Inventors: Wen-Yao Hsieh, Sanchong (TW); Che-Yu Chiu, Hsin-Chu (TW); Anwei Peng, Hsin-Chu (TW); Jian-Hung Chen, Shulin (TW); Hsueh-Chen Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/890,975

(22) Filed: May 9, 2013

(65) Prior Publication Data

US 2013/0253681 A1 Sep. 26, 2013

Related U.S. Application Data

(62) Division of application No. 12/617,380, filed on Nov. 12, 2009, now Pat. No. 8,463,419.

(60) Provisional application No. 61/146,582, filed on Jan. 22, 2009.

(51) Int. Cl.
| | |
|---|---|
| *G06F 19/00* | (2011.01) |
| *G05B 19/02* | (2006.01) |
| *G03F 7/20* | (2006.01) |
| *G05B 19/418* | (2006.01) |
| *G05B 19/402* | (2006.01) |

(52) U.S. Cl.
CPC ............ *G05B 19/02* (2013.01); *G03F 7/70458* (2013.01); *G05B 2219/45031* (2013.01); *G05B 19/41885* (2013.01); *G05B 19/402* (2013.01); *Y10S 438/975* (2013.01)
USPC .......................................... 700/121; 438/975

(58) Field of Classification Search
USPC ........................... 700/121; 438/401, 462, 975
See application file for complete search history.

(56) References Cited

U.S. PATENT DOCUMENTS

| | | |
|---|---|---|
| 2005/0055122 A1 | 3/2005 | Lin et al. |
| 2007/0061773 A1 | 3/2007 | Ye et al. |
| 2010/0023151 A1 | 1/2010 | Shieh et al. |

OTHER PUBLICATIONS

Akcalt, E., et al., "Cycle-Time Improvements for Photolithography Process in Semiconductor Manufacturing," IEEE Transactions on Semiconductor Manufacturing, Feb. 2001, pp. 48-56, vol. 14, No. 1, IEEE.

*Primary Examiner* — Mohammad Ali
*Assistant Examiner* — Nathan Laughlin
(74) *Attorney, Agent, or Firm* — Slater and Matsil, L.L.P.

(57) ABSTRACT

A method for aligning a photolithographic machine in an automated semiconductor manufacturing system is provided. The method may include identifying a maximum precision degree for a wafer and identifying a maximum overlay correction value. The method may simulate one or more algorithms to determine whether an algorithm aligns a leading lot within alignment specifications. The method may align a photolithography machine using an algorithm selected based on the simulations.

18 Claims, 5 Drawing Sheets

| SIMULATION RESULTS | | | | | | | | | | | | |
|---|---|---|---|---|---|---|---|---|---|---|---|---|
| SIMULATION | 1 | 2 | 3 | 4 | 5 | 6 | 7 | 8 | 9 | 10 | 11 | 12 |
| ADJUSTMENT IN X | -0.006 | 0.000 | 0.0003 | 0.0006 | 0.008 | 0.011 | 0.012 | 0.014 | 0.0145 | 0.021 | 0.0235 | 0.024 |

MAXIMUM OVERLAY CORRECTION VALUE: +/- 30nm
MAXIMUM PRECISION DEGREE: 50nm
LARGEST POSITIVE ADJUSTMENT: 0.024μm
LARGEST NEGATIVE ADJUSTMENT: -0.006μm
PRECISION DEGREE = 0.024-(-0.006) = 0.03μm
0.03μm = 30nm < 50nm

SYSTEM AND METHOD FOR IMPROVED AUTOMATED SEMICONDUCTOR WAFER MANUFACTURING

CROSS-REFERENCE TO RELATED APPLICATIONS

This application is a divisional of U.S. patent application Ser. No. 12/617,380, filed on Nov. 12, 2009, entitled "System and Method for Improved Automated Semiconductor Wafer Manufacturing," which application claims the benefit of U.S. Provisional Application No. 61/146,582, filed on Jan. 22, 2009, entitled "System and Method for Improved Automated Semiconductor Wafer Manufacturing," both of which are hereby incorporated herein by reference.

TECHNICAL FIELD

The present invention relates generally to a system and method for improved automated semiconductor wafer manufacturing and, more particularly, to a system and method for identifying an algorithm to align leading lots.

BACKGROUND

Modern photolithographic semiconductor fabrication processes produce integrated circuits on a semiconductor wafer by forming patterns in successive layers. One method of creating a layer is to form a layer of a desired material, form a photoresist layer on the material layer, expose light through a mask to impinge upon the photoresist, and develop the photoresist to create a pattern. The wafer is then etched, removing selected portions of the material underlying the photoresist corresponding to the pattern exposed through the mask. Thereafter, the exposed photoresist is removed, and another material layer is applied, followed by a photoresist as the formation process continues. As part of the pattern creation process, the wafer is often moved from one photolithography tool to another for the creation of the successive layers.

In order to ensure that a working integrated circuit results from the photolithography processes, various elements within each tool, for example, a chuck holding a wafer and a mask holder holding a mask, must be aligned to ensure each created layer is in the appropriate position relative to the previous layer. Generally, some level of misalignment occurs between the layers during the production process. Overlay control attempts to monitor and correct the misalignment between the various layers.

One of the most difficult areas to correct overlay misalignment involves leading lots, the initial group of wafers produced with a mask and tool combination. This is particularly true in automated manufacturing facilities where, in order to avoid leading lot problems, a wafer is often confined to the particular tool used to expose the initial layer. In an attempt to reduce overlay misalignment problems for subsequent layers, the mask is changed in the tool prior to exposure of the next layer, thus allowing formation of the next layer without having to realign the wafer. The frequent mask changes generate extra loading requirements that necessitate a human supervisor to correctly arrange each lot according to the tool used for the initial exposure. Human involvement and frequent mask changes that require alignment increase inefficiency and greatly increase semiconductor production time. Additionally, these automated systems cause process interlock that increases operation loading because the operator cannot visually identify the leading lot wafers.

Generally, fully automated semiconductor manufacturing methods do not record the overlay alignment values as a reference. Failure to record overlay alignment values introduces additional rework due to misalignment because the system cannot relate and adjust the present production process based on the experiences of past production processes. Therefore, there is a need for a system and/or method for improved automated semiconductor wafer manufacturing that addresses at least some of the problems and disadvantages associated with conventional methods.

SUMMARY OF THE INVENTION

These and other problems are generally solved or circumvented, and technical advantages are generally achieved, by embodiments of the present invention which provide an improved automated semiconductor wafer manufacturing process.

In accordance with one aspect of the present invention, a system for automated semiconductor wafer manufacturing is provided. The system includes a smart overlay control (SOC) database having empirical alignment data related to overlay alignment, and a simulation module communicatively coupled to the SOC database, the simulation module determining a simulated overlay alignment of a wafer on a plurality of photolithography tools in a tool bank based on the empirical alignment data stored in the SOC database. The system also includes a dispatch module communicatively coupled to the SOC database and the simulation module, the dispatch module controlling the dispatch of the wafer to one of the plurality of photolithography tools in the tool bank based at least in part on the simulated overlay alignment.

In accordance with another aspect of the present invention, a method for aligning a photolithographic machine in an automated semiconductor manufacturing system is provided. The method identifies a maximum precision degree for a particular wafer, and a maximum overlay correction value. The method then selects a first algorithm, simulates the first algorithm, and determines whether the first algorithm aligns a leading lot within alignment specifications. Upon determining that the first algorithm does not align a leading lot within alignment specifications, the method selects a second algorithm, and repeats the steps of simulating and determining using the second algorithm. Finally, the method aligns a photolithography machine using the algorithm selected based on the simulations.

In accordance with yet another aspect of the present invention, a computer program product for providing an automated semiconductor wafer manufacturing process is provided. The computer program product includes a medium with a computer program embodied thereon, the computer program comprising computer program code for selecting a photolithography machine to process a wafer from a plurality of photolithography machines in a tool bank, and computer program code for simulating one or more alignment algorithms for the wafer, the simulations identifying a selected algorithm based at least in part on empirical alignment data. The computer program also includes computer program code for aligning the photolithography machine according to the selected algorithm.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a system for processing leading lot wafers on a selected tool based on an improved algorithm simulation.

Figures 1, 3C:
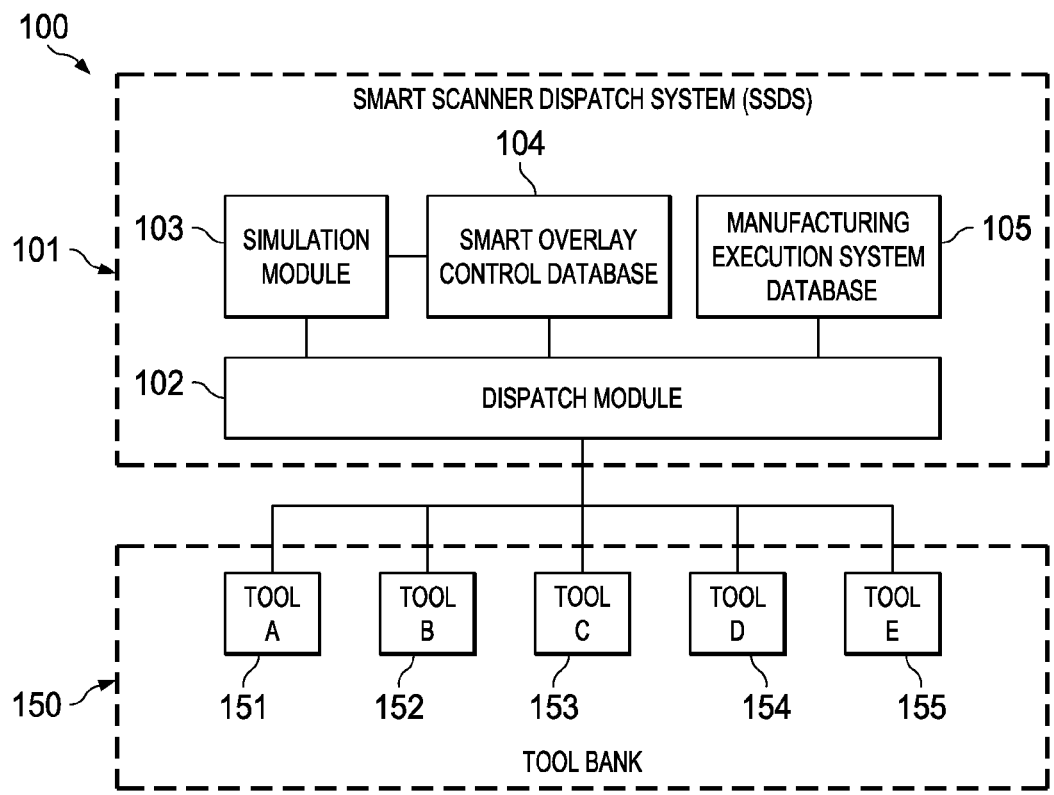
FIG. 1 is a schematic illustration of various components of an automated system for semiconductor wafer production.
FIG. 3C is a table illustrating various overlay correction values calculated in an automated system for semiconductor wafer production.

With reference now to FIG. 1, there is shown a schematic diagram illustrating elements of a system 100 for wafer dispatch. Specifically, system 100 comprises a smart scanner dispatch system (SSDS) 101 and a tool bank 150. The tool bank 150 preferably comprises a plurality of tools represented by Tool A 151, Tool B 152, Tool C 153, Tool D 154, and Tool E 155. While five tools are shown in the tool bank 150, the tool bank 150 may comprise any number of tools. Each of the plurality of tools are preferably capable of exposing leading lots with various masks, such as Mine type lithography machines, deep ultra-violet machines (DUV), or the like.

In an embodiment, the SSDS 101 comprises an automated manufacturing system capable of controlling the wafer production process. Preferably, the SSDS 101 produces semiconductor wafers through an automated process that controls movement of the wafer in process (WIP) during formation of each layer of the WIP. The SSDS 101, and the components thereof, may comprise a computer program product accessible from a computer-usable or computer-readable medium providing program code for use by or in connection with a computer or any instruction execution system. For the purposes of this description, a computer-usable or computer-readable medium can be any apparatus or otherwise tangible medium that can contain, store, communicate, propagate, or transport the program for use by or in connection with the instruction execution system, apparatus, or device.

The computer-readable medium of the SSDS 101 can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD.

In an embodiment, the SSDS 101 includes a data processing system suitable for storing and/or executing program code and at least one processor coupled directly or indirectly to memory elements through a system bus. The memory elements may include local memory employed during actual execution of the program code, bulk storage, and cache memories, which provide temporary storage of at least some program code in order to reduce the number of times code must be retrieved from bulk storage during execution.

In an embodiment, the SSDS 101 will include input/output (I/O) devices (including, but not limited to, keyboards, displays, pointing devices, etc.) coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the currently available types of network adapters.

In the illustrated embodiment, the SSDS 101 further comprises a dispatch module 102, a simulation module 103, a smart overlay control (SOC) database 104, and a manufacturing execution system (MES) database 105. The various elements listed above are shown for explanatory purposes only, and a person of ordinary skill in the art will understand that the various elements can be embodied in both simpler and more complex systems. The present invention also contemplates the various modules depicted above condensed to fewer modules capable of performing the tasks described below. For ease of description, additional components of the SSDS 101 necessary for implementation of the wafer production process that are known by a person of ordinary skill in the art are not included in this description, but are understood to be included as part of the disclosed invention. It should also be noted that the modules may be implemented in software, hardware, or a combination of hardware and software.

In a preferred embodiment, the dispatch module 102 comprises a module by which the SSDS 101 controls the dispatch of WIPs to any tool of the tool bank 150. As shown in FIG. 1, the dispatch module 102 communicatively couples to the simulation module 103 and the SOC database 104, and the simulation module 103 further communicatively couples to the SOC database 104. The simulation module 103 preferably comprises logic circuitry and/or computer code for simulating overlay alignment of leadings lots on any tool in the tool bank 150. Overlay alignment is expressed in terms of x and y components that describe the planar distance from a center point at which elements of a tool are aligned. Looking at a WIP positioned on a tool from a top view, the y component describes vertical positioning and the x component describes horizontal positioning. In each tool of the tool bank 150 described, there are two elements to align, a mask and a WIP. The mask and the WIP must be aligned in both the x and y positions for proper exposure of each successive layer.

As described in more detail below, the simulation module 103 preferably performs a plurality of simulations with predetermined algorithms to determine whether the algorithm is suitable for calculating leading lot overlay alignment on a given tool. Predetermined algorithms are pre-programmed algorithms that attempt to predict and compensate for leading lot overlay misalignment using a variety of empirical alignment data. The simulation module 103 preferably generates a range of overlay correction values, i.e., the positional translation or the amount of shift in the x position or the y position, of each element, i.e., the wafer and the mask, of the tool in the tool bank 150 currently under simulation. Each simulated overlay correction value is compared to a maximum overlay correction value, and in the event that any one of the simulated overlay correction values is outside of a maximum overlay correction value, the algorithm is not used on the tool in the tool bank 150 currently under stimulation. The maximum overlay correction value is a value dynamically calculated or determined from user input.

Preferably, the simulation module 103 selects a first predetermined algorithm that uses historical empirical alignment data from the SOC database 104 to compensate for leading lot misalignment. In an embodiment, the first predetermined algorithm compensates for leading lot misalignment based on historical overlay correction values used with the same mask on different tools. The simulation module 103 performs a plurality of simulations generating a range of overlay correction values for a selected tool in the tool bank 150. Each overlay correction value generated by the simulation module 103 is compared against the maximum overlay correction value, if a simulated overlay correction value generated by the simulation module 103 is larger than the maximum overlay correction value, then the first predetermined algorithm is not used.

The simulation module 103 also determines a precision degree that expresses the variance in the overlay correction values of each positional component of each element in the tool for each algorithm simulated. The simulation module 103 compares the precision degree of each algorithm to a maximum precision degree for the leading lot WIP to determine whether each algorithm will produce overlay alignment within a desired range. The maximum precision degree preferably comprises an input defined by the user based on the layer currently being created on the particular WIP, or a value dynamically calculated by the process described herein. The maximum precision degree preferably expresses the variance allowable by the user for the particular layer in process.

If the simulated overlay correction values generated by the first algorithm are within the maximum overlay correction value, the simulation module 103 preferably determines a precision degree that corresponds to the maximum difference in the range of overlay correction values produced by the first predetermined algorithm for the selected tool in the tool bank 150. The precision degree is compared to the maximum precision degree. Preferably, if the precision degree for the first algorithm is greater than the maximum precision degree, then the first predetermined algorithm is not used to calculate the leading lot overlay correction value for the WIP on the selected tool, and the simulation process is performed again using a second predetermined algorithm.

The second predetermined algorithm compensates for leading lot misalignment based on historical overlay correction values used with the same mask on different tools and different masks on the same tool. If neither predetermined algorithm produces results within the maximum overlay correction value or the maximum precision degree, other compensation methods are used for the leading lot overlay alignment, such as the central line OD method or compensation based on process engineering experience.

A person of ordinary skill in the art will understand that the predetermined algorithms described above may be used in reverse order. For example, in another embodiment, the first algorithm may compensate for leading lot misalignment based on historical overlay correction values used with the same mask on different tools and different masks on the same tool, and the second algorithm may compensate for leading lot misalignment based on historical overlay correction values used with the same mask on different tools. Furthermore, other algorithms may be used in the described simulation process in order to correctly select an algorithm to align the leading lot WIP on a selected tool.

The dispatch module 102 also communicatively couples to the SOC database 104. The SOC database 104 preferably comprises a storage medium containing historical empirical alignment data for some period of time, such as the prior 180 days. The empirical alignment data includes overlay correction values for previous WIPs exposed with the same mask on different tools of the tool bank 150, and empirical alignment data corresponding to overlay correction values for WIPs exposed with different masks on the same tool in the tool bank 150. Preferably, the SOC database 104 also includes empirical alignment data corresponding to parameters used by other algorithms to overlay subsequent layers on a WIP. For example, the SOC database 104 can include empirical alignment data used by algorithms to align a tool using the central line OD system.

Additionally, the simulation module 103 can access the empirical alignment data stored in the SOC database 104 and store in the SOC database 104 simulation data produced by the simulation process of the simulation module 103. The SOC database 104 also communicatively couples to the dispatch module 102 such that the dispatch module 102 can access the simulation data provided by the simulation module 103 for the WIP on the selected tool.

In an embodiment, the dispatch module 102 also communicatively couples to the MES database 105. The MES database 105 comprises scripts or configuration data that control the actions of the SSDS 101, and more specifically the dispatch module 102. The MES database 105 can comprise a predefined execution system having information relating to the batch status of the WIP. The batch status of the WIP preferably corresponds to the current process status of the WIP and more specifically to the process status of the layer to be created on the WIP and the mask to be used to create that layer. One example of the MES database 105 is the MES software database produced as part of the PROMIS software line, although other manufacturers' systems, as well as independently produced systems, are contemplated.

In operation, the SSDS 101 receives a WIP leading lot for dispatch to a tool in the tool bank 150. The dispatch module 102 accesses the MES database 105 for information regarding the batch status of the WIP, and determines which tools in the tool bank 150 are equipped with the appropriate mask to pattern the designated layer. The dispatch module 102 selects a tool to process the WIP based on the loading status of each tool in the tool bank 150, the WIP batch status retrieved from the MES database 105, and the expiration date of the empirical alignment data stored in the SOC database 104.

The simulation module 103 preferably performs a series of simulations, described in more detail below, to determine which predetermined algorithm produces an acceptable overlay alignment for the mask and selected tool combination for the leading lot WIP. The simulation module 103 stores the simulation results in the SOC database 104. The dispatch module 102 retrieves simulation results for the selected tool from the SOC database 104 for the leading lot WIP. The dispatch module 102 dispatches the WIP to the selected tool, and the selected tool uses the predetermined algorithm selected by the simulation module 103 to align the WIP and mask within specification for the selected tool in the tool bank 150, thus correctly aligning the leading lot WIP. The SSDS 101 stores the alignment data for the leading lot WIP process in the SOC database 104, and the remaining lot wafers are processed on the selected tool; the alignment of successive lots is adjusted based on the alignment data of the prior lots on the selected tool.

Figure 2:
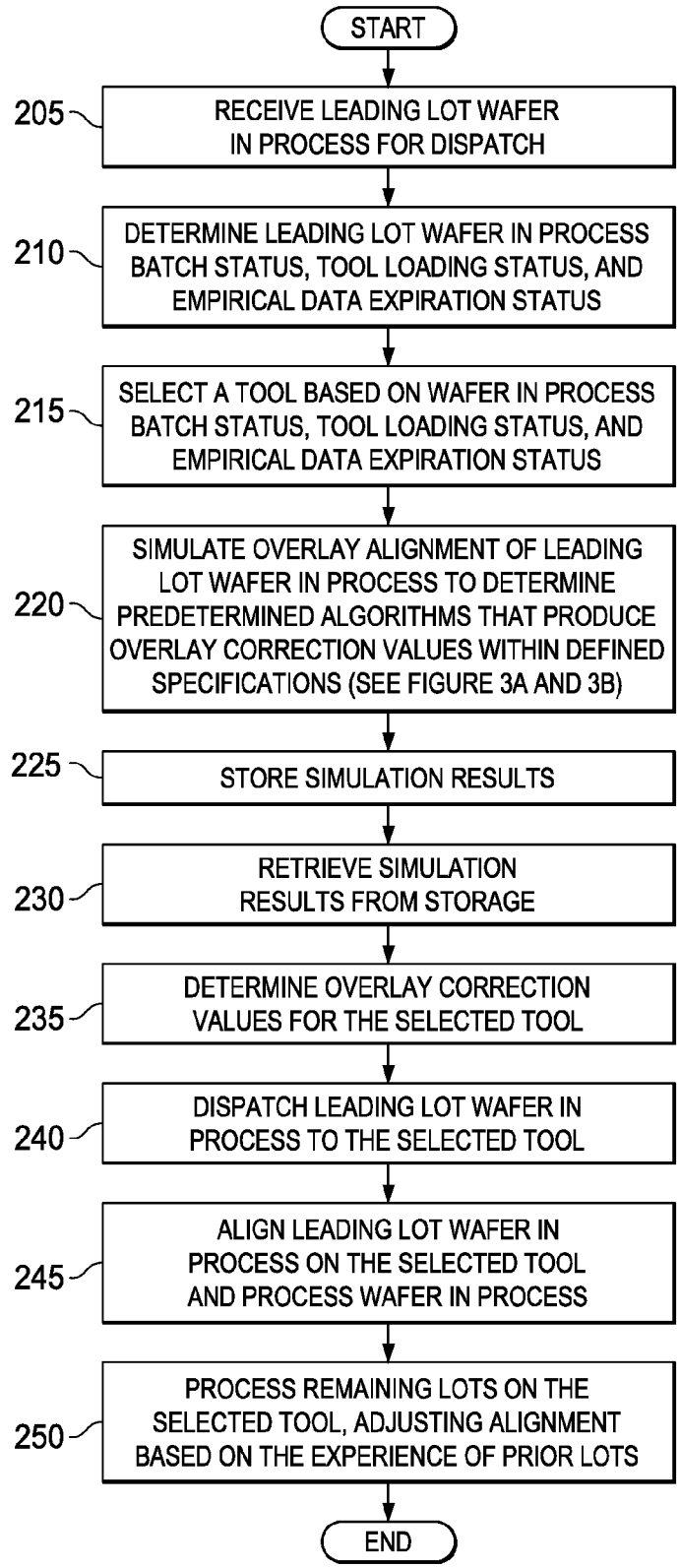
FIG. 2 is a high-level flow chart depicting operative steps performed by an automated system for semiconductor wafer production.

FIG. 2 is a flowchart further illustrating an operation of the system 100 that may be implemented in accordance with a preferred embodiment. As indicated at block 205, the process begins by the SSDS 101 receiving a leading lot WIP for dispatch. Next, as indicated at block 210, the dispatch module 102 determines WIP batch status information from the MES database 105, tool loading status from the tool bank 150, and expiration status of empirical alignment data from the SOC database 104.

As indicated at block 215, the dispatch module 102 then selects a tool, e.g., Tool A 151, in the tool bank 150 based on the WIP batch status, the tool loading status, and the empirical data expiration status. Thereafter, the simulation module 103 simulates overlay alignment of the leading lot WIP using predetermined algorithms that produce overlay correction values within specifications for the selected tool that are dynamically calculated during the process or determined by user input, as indicated at block 220. Processes that may be used to perform this step are discussed in greater detail below with reference to FIGS. 3A and 3B.

The process continues at block 225 where the simulation module 103 stores the simulation results in the SOC database 104. Next, as indicated at block 230, the dispatch module 102 retrieves the simulation results stored in the SOC database 104. Thereafter, the dispatch module 102 determines the leading lot overlay correction value using the predetermined algorithm selected by the simulation module 103 for the Tool A 151 in the tool bank 150, as indicated at block 235.

Referring now to block 240, the dispatch module 102 dispatches the leading lot WIP to the Tool A 151 in the tool bank 150. Next, as indicated at block 245, the Tool A 151 in the tool bank 150 aligns the leading lot WIP according to the overlay correction value calculated by the selected predetermined algorithm and processes the leading lot WIP. The process ends, as indicated at block 250, when the remaining lots are processed on the Tool A 151 by adjusting the alignment of the remaining lots based on the experience of the prior processed lots.

Figure 3A:
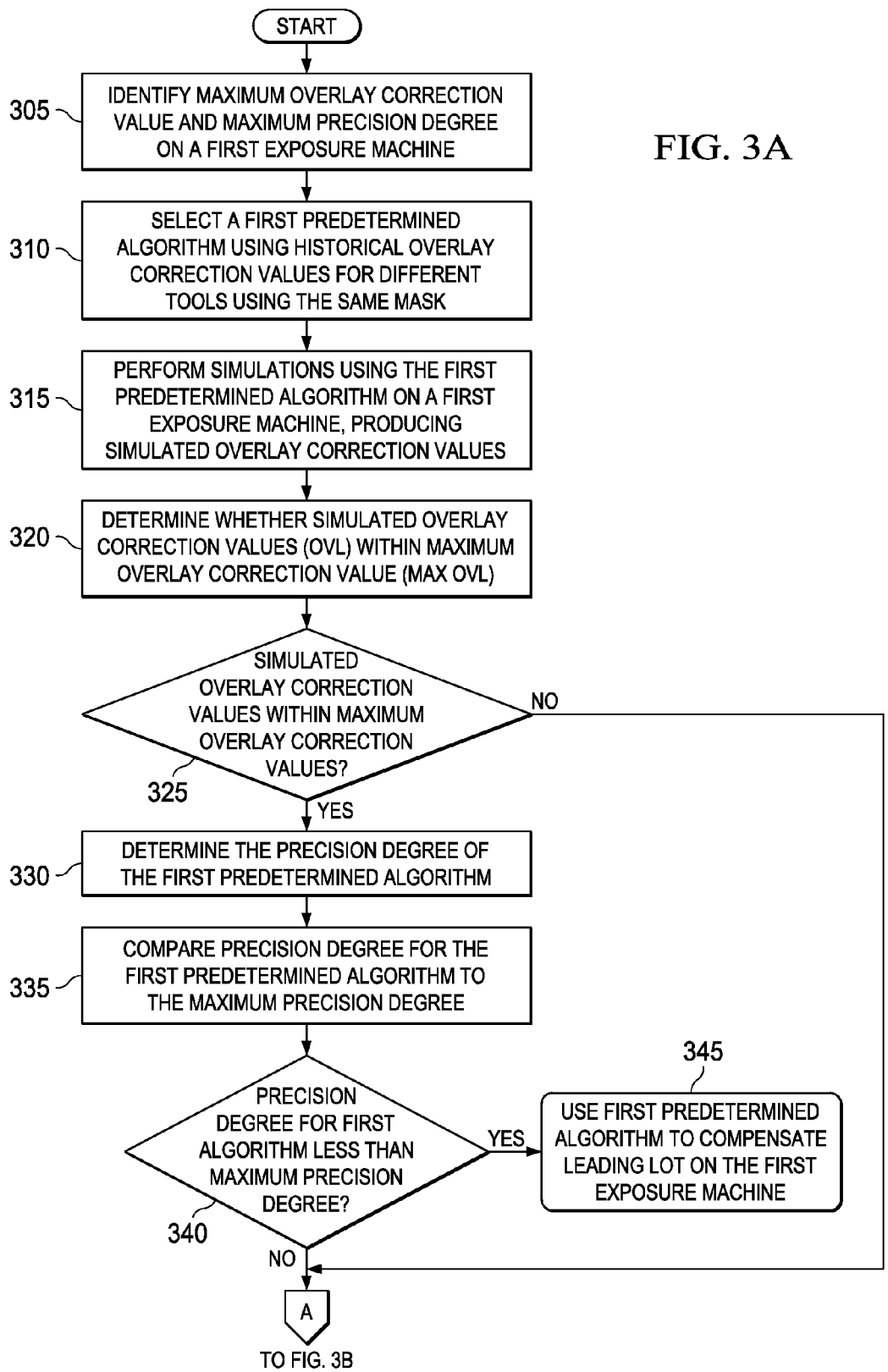
FIGS. 3A and 3B are high-level flow charts depicting operative steps performed by a simulation module as part of an automated system for semiconductor wafer production.
Figure 3B:
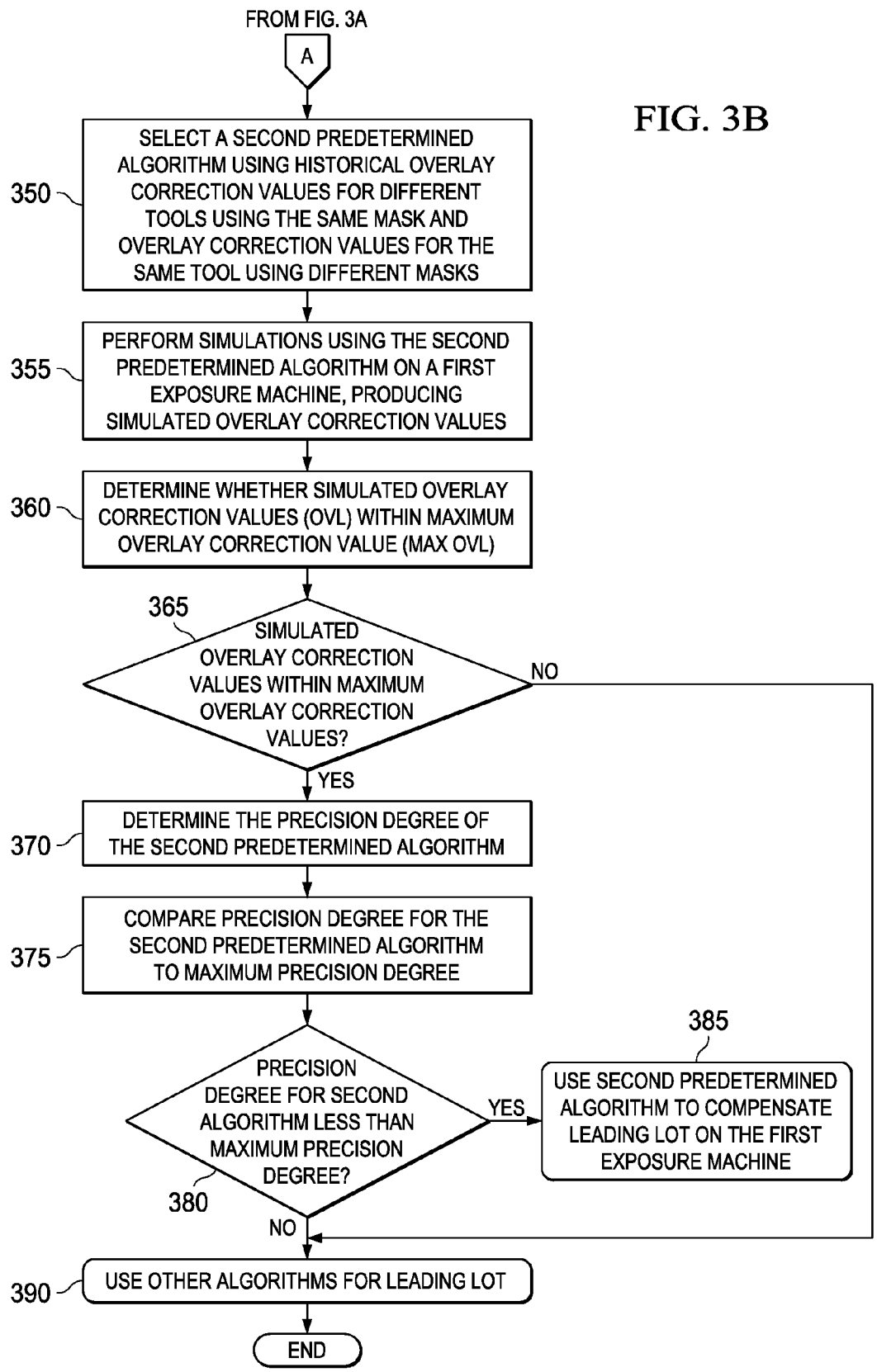

FIG. 3A and FIG. 3B illustrate high-level flow diagrams depicting the operative steps performed by the simulation module 103 when simulating overlay alignment of leading lot WIP as described at block 220 of FIG. 2. As indicated at block 305, the process begins when the simulation module 103 identifies the maximum overlay correction value and the maximum precision degree for the current WIP on a first exposure machine. The maximum overlay correction value and the maximum precision degree are preferably user-defined inputs, but may be determined dynamically.

Next, as indicated at block 310, the simulation module 103 selects a first predetermined algorithm compensating for overlay alignment based on historical overlay correction values for different tools using the same mask. For example, the simulation module 103 selects a first predetermined algorithm having historical empirical alignment data corresponding to overlay correction values for different tools using the same mask stored in the SOC database 104. The process continues, as indicated at block 315, when the simulation module 103 performs simulations on the first exposure machine using the first predetermined algorithm, producing a plurality simulated overlay correction values.

Thereafter, the simulation module 103 determines if the simulated overlay correction values are within the maximum overlay correction value, as indicated at 320. As indicated at decisional block 325, in the event that the simulated overlay correction values are within the maximum overlay correction value, the process continues on the YES path to block 330, where the simulation module 103 determines the precision degree of the first predetermined algorithm based on the simulated overlay correction values. In the event that any simulated overlay correction value is outside of the maximum overlay correction value, the process continues on the NO path to block 350 of FIG. 3B as indicated by marker A.

The simulation module 103 then compares the precision degree for the first predetermined algorithm to the maximum precision degree for the WIP, as indicated at block 335. Referring to decisional block 340, if the precision degree for the first predetermined algorithm is less than the maximum precision degree then the process continues on the YES path to block 345 where the simulation module 103 stores in the SOC database 104 that the first predetermined algorithm can be used to compensate for the leading lot on the first exposure machine.

If, as indicated at decisional block 340, the precision degree for the first predetermined algorithm is greater than the maximum precision degree, then the process continues on the NO path to block 350 of FIG. 3B as indicated by marker A. Referring now to block 350, the simulation module 103 selects a second predetermined algorithm that determines leading lot overlay correction values based on historical overlay correction values for different tools using the same mask and historical overlay correction values for the same tool using different masks. Next, as indicated at block 355, the simulation module 103 performs simulations using the second predetermined algorithm on the first exposure machine, producing a plurality of simulated overlay correction values.

Thereafter, the simulation module 103 determines if the simulated overlay correction values are within the maximum overlay correction value, as indicated at block 360. Referring to decisional block 365, in the event that the simulated overlay correction values produced by the second predetermined algorithm are within the maximum overlay correction value, the process continues on the YES path to block 370, where the simulation module 103 determines the precision degree of the second predetermined algorithm. In the event that the simulated overlay correction values for the second predetermined algorithm are not within the maximum overlay correction value, the process continues on the NO path to block 390.

Next, as indicated at block 375, the simulation module 103 compares the precision degree for the second predetermined algorithm to the maximum precision degree for the WIP. If, as indicated at decisional block 380, the precision degree for the second predetermined algorithm is less than the maximum precision degree for the WIP then the process continues on the YES path to block 385, where the simulation module 103 stores in the SOC database 104 that the second predetermined algorithm can be used to compensate for the leading lot WIP on the first exposure machine. If, as indicated at decisional block 380, the precision degree for the second predetermined algorithm is greater than the maximum precision degree, the process continues on the NO path to block 390, where the simulation module 103 stores in the SOC database 104 an instruction to use other algorithms and methods to align the leading lot WIP on the first exposure machine.

With reference now to FIG. 3C, there is shown a table illustrating an example of the determination of the precision degree of the x positional component of an element in a tool by the simulation module 103 as described above in block 330 and block 370 of FIG. 3A and FIG. 3B, respectively. In the illustrated operative embodiment, the simulation module 103 receives a maximum precision degree and a maximum overlay correction value for the x positional component for the current WIP. As shown in FIG. 3C, the maximum precision degree value is 50 nanometers and the maximum overlay correction value is +/−30 nanometers. The simulation module 103 then selects a first predetermined algorithm that calculates a leading lot overlay correction value based on historical overlay correction values stored in the SOC database 104 from different tools using the same mask. The simulation module 103 conducts a plurality of simulations, each simulation producing a different overlay correction value for the x positional component. In the illustrated embodiment, for example, twelve simulations are performed giving various overlay correction values for the adjustment in the x direction necessary to align an element of the tool in the simulation. These values are shown in the table in FIG. 3C and correspond to a range of possible values for x. Each simulated value is compared to the maximum overlay correction value, and if any simulated value for the first predetermined algorithm on the selected tool is outside of the maximum overlay correction value, then the first predetermined algorithm is not used on the selected tool, and the simulation module 103 selects a second predetermined algorithm.

If all the simulated overlay correction values for the first predetermined algorithm are within the maximum overlay correction value, the precision degree of the first predetermined algorithm is determined. The precision degree of the x positions component is the difference between the largest positive adjustment in x and the largest negative adjustment in x. As shown in FIG. 3C, the largest positive adjustment is 0.024 µm, and the largest negative adjustment is −0.006 µm. Thus, the precision degree, the difference between the two, is 0.03 µm or 30 nm. The precision degree for the x positional component for the element is then compared against the maximum precision degree of the x positional component for that element. In this example, the precision degree of 30 nm is compared to the maximum precision degree of 50 nm. If the precision degree of the first predetermined algorithm is less than the maximum precision degree, the simulation module 103 stores the first predetermined algorithm in the SOC database 104 as the algorithm available for use to align the leading lot WIP on the simulated tool. If the precision degree for the x positional component is greater than the maximum precision degree for the x positional component of the element, the simulation module 103 does not store the first predetermined algorithm in the SOC database 104 as the algorithm to use to align the leading lot WIP on the simulated tool.

If the precision degree of the first predetermined algorithm for the x positional component is greater than the maximum precision degree for the x positional component of the element, the simulation module 103 selects a second predetermined algorithm which compensates for leading lot overlay correction based on historical overlay correction values from different tools using the same mask, and historical overlay correction values from the same tool using different masks. The simulation module 103 determines a range of overlay correction values for the second predetermined algorithm, comparing each to the maximum overlay correction value. Each simulated overlay correction value for the second predetermined algorithm is compared to the maximum overlay correction value, if any simulated overlay correction value for the second predetermined algorithm on the selected tool is outside of the maximum overlay correction value, then the second predetermined algorithm is not used on the selected tool and other leading lot compensation algorithms are used.

If all the simulated overlay correction values for the second predetermined algorithm are within the maximum overlay correction value, then the precision degree of the second predetermined algorithm is determined. If the precision degree for the second predetermined algorithm is less than the maximum precision degree, the simulation module 103 stores the second predetermined algorithm in the SOC database 104 as the algorithm available for use to align the leading lot WIP on the simulated tool. If the precision degree of the second predetermined algorithm for the x positional component is greater than the maximum precision degree for the x positional component of the element, the simulation module 103 does not store the second predetermined algorithm in the SOC database 104 for use to align the leading lot WIP on the simulated tool. One skilled in the art will understand that the previously described process will be repeated until an appropriate predetermined algorithm is found that produces overlay correction values within specification for both the x and y positional components of each element of each tool.

Prior methods of wafer automation often required that the wafer be exposed on the same tool for all layers to reduce the overlay alignment errors. One advantage of the present invention is that the leading lot WIP simulation method described herein as part of an automated wafer production system allows for a wafer to be moved between tools at any point of the fabrication process.

Figure 4:
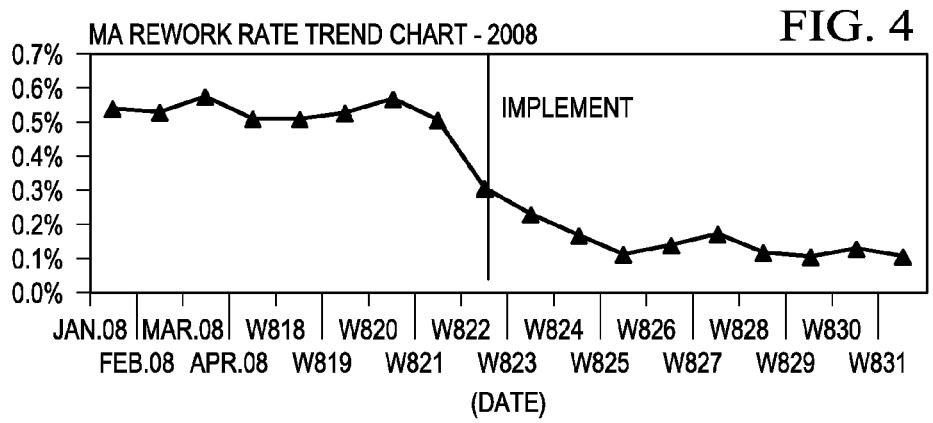
FIGS. 4-6 are graphical representations of advantages of an automated system for semiconductor wafer production.
Figure 5:
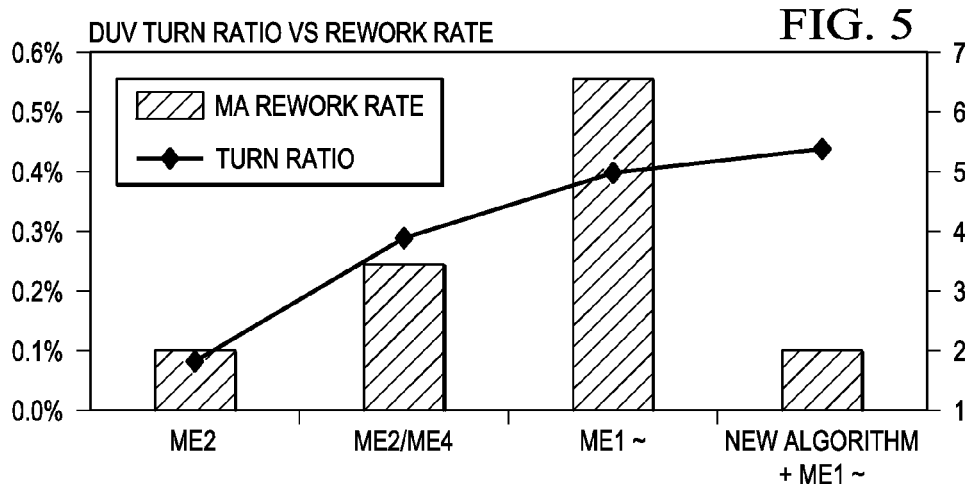
Figure 6:
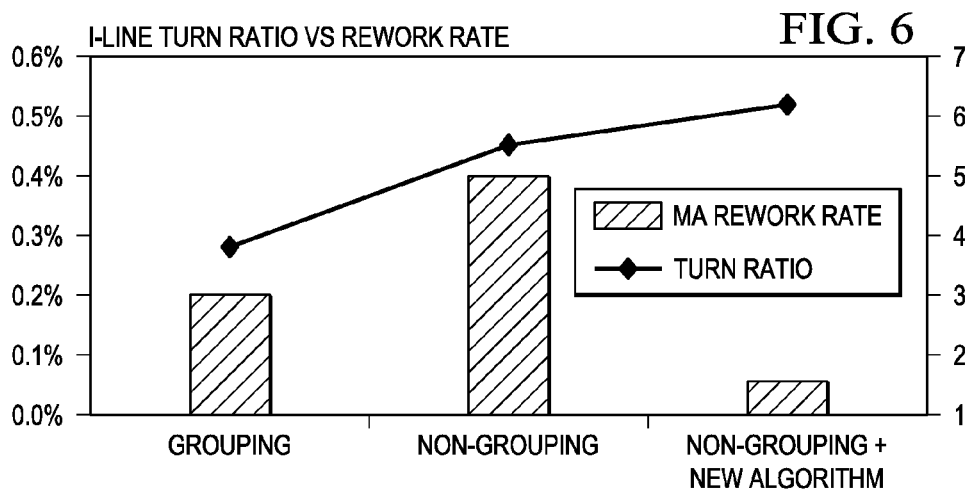

FIGS. 4-6 illustrate improvements that may be achieved using embodiments of the present invention. For example, with reference now to FIG. 4, there is shown a graphical representation of the percentage of misalignment rework rates. As can be seen, embodiments of the present invention have yielded a 70% decrease in the misalignment rework rate. As another example, FIGS. 5 and 6 illustrate a 200% increase in the turn ratio of deep ultraviolet machines, and a 60% increase in the turn ratio of I-Line system machines.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for aligning a photolithographic machine in an automated semiconductor manufacturing system, the method comprising:

identifying a maximum precision degree for a particular wafer;

identifying a maximum overlay correction value;

selecting a first algorithm;

simulating the first algorithm;

determining whether the first algorithm aligns a leading lot within alignment specifications;

upon determining that the first algorithm does not align a leading lot within alignment specifications, selecting a second algorithm, and repeating the steps of simulating and determining using the second algorithm; and aligning a photolithography machine using the algorithm selected based on the simulations, wherein at least one of the first algorithm and the second algorithm compensates for leading lot behavior based at least in part on historical empirical alignment data and an expiration status of the historical empirical alignment data, wherein the expiration status is based on an expiration date.

2. The method of claim 1, wherein the historical empirical alignment data corresponds at least in part to the use of a single photolithography mask with a plurality of photolithography machines.

3. The method of claim 1, wherein the historical empirical alignment data corresponds at least in part to the use of different photolithography machines with a same mask and different photolithography masks on a same machine.

4. The method of claim 1, wherein the maximum precision degree represents a maximum allowable variance for the wafer.

5. The method of claim 1, wherein the simulating the first algorithm comprises:
    simulating an overlay alignment of a wafer on a particular photolithography machine using the first algorithm to obtain a plurality of overlay correction values;
    comparing the plurality of overlay correction values to the maximum overlay correction value;
    in the event that the plurality of overlay correction values are within the maximum overlay correction value, determining a precision degree of the first algorithm;
    comparing the precision degree of the first algorithm to the maximum precision degree for the wafer; and
    in the event that the precision degree of the first algorithm is less than the maximum precision degree for the particular wafer, identifying the first algorithm as useable on the simulated photolithography machine.

6. The method of claim 5, wherein each of the plurality of overlay correction values represents an amount of shift from a neutral position of at least one of the wafer and a photolithography mask in at least one direction.

7. The method of claim 6, wherein the precision degree of the first algorithm represents a variance in the overlay correction values in the at least one direction for the at least one of the wafer and the photolithography mask.

8. The method of claim 5, the determining the precision degree further comprising:
    determining a difference between a largest positive adjustment and a largest negative adjustment along a first direction for at least one of the wafer and a photolithography mask.

9. The method of claim 8, the determining the precision degree further comprising:
    determining a difference between a largest positive adjustment and a largest negative adjustment along a second direction for at least one of the wafer and a photolithography mask.

10. A computer program product for aligning a photolithographic machine in an automated semiconductor manufacturing system, the computer program product having a non-transitory machine-readable medium with a computer program embodied thereon, the computer program comprising:
    computer program code for identifying a maximum precision degree for a particular wafer;
    computer program code for identifying a maximum overlay correction value;
    computer program code for selecting a first algorithm;
    computer program code for simulating the first algorithm;
    computer program code for determining whether the first algorithm aligns a leading lot within alignment specifications;
    upon determining that the first algorithm does not align a leading lot within alignment specifications, computer program code selecting a second algorithm, and repeating the steps of simulating and determining using the second algorithm; and
    computer program code for aligning a photolithography machine using the algorithm selected based on the simulations, wherein at least one of the first algorithm and the second algorithm compensates for leading lot behavior based at least in part on historical empirical alignment data and an expiration status of the historical empirical alignment data, wherein the expiration status is based on an expiration date.

11. The computer program product of claim 10, wherein the historical empirical alignment data corresponds to the use of a single photolithography mask with a plurality of photolithography machines.

12. The computer program product of claim 10, wherein the historical empirical alignment data corresponds to the use of different photolithography machines with a same mask and different photolithography masks on a same machine.

13. The computer program product of claim 10, wherein the maximum precision degree represents a maximum allowable variance for the wafer.

14. The computer program product of claim 10, wherein the computer program code for the simulating the first algorithm comprises:
    computer program code for simulating an overlay alignment of a wafer on a particular photolithography machine using the first algorithm to obtain a plurality of overlay correction values;
    computer program code for comparing the plurality of overlay correction values to the maximum overlay correction value;
    in the event that the plurality of overlay correction values are within the maximum overlay correction value, computer program code for determining a precision degree of the first algorithm;
    computer program code for comparing the precision degree of the first algorithm to the maximum precision degree for the wafer; and
    in the event that the precision degree of the first algorithm is less than the maximum precision degree for the particular wafer, computer program code for identifying the first algorithm as useable on the simulated photolithography machine.

15. The computer program product of claim 14, wherein each of the plurality of overlay correction values represents an amount of shift from a neutral position of at least one of the wafer and a photolithography mask in at least one direction.

16. The computer program product of claim 15, wherein the precision degree of the first algorithm represents a variance in the overlay correction values in the at least one direction for the at least one of the wafer and the photolithography mask.

17. The computer program product of claim 14, the computer program code for the determining the precision degree further comprising:
    computer program code for determining a difference between a largest positive adjustment and a largest negative adjustment along a first direction for at least one of the wafer and a photolithography mask.

18. The computer program product of claim 17, the computer program code for the determining the precision degree further comprising:
    computer program code for determining a difference between a largest positive adjustment and a largest negative adjustment along a second direction for at least one of the wafer and a photolithography mask.

* * * * *